United States Patent
Shen et al.

(10) Patent No.: US 10,623,710 B2
(45) Date of Patent: Apr. 14, 2020

(54) HD COLOR IMAGING USING MONOCHROMATIC CMOS IMAGE SENSORS INTEGRATED IN 3D PACKAGE

(71) Applicant: Invensas Corporation, San Jose, CA (US)

(72) Inventors: Hong Shen, Palo Alto, CA (US); Liang Wang, Newark, CA (US); Guilian Gao, San Jose, CA (US); Arkalgud R. Sitaram, Cupertino, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 16/206,549

(22) Filed: Nov. 30, 2018

(65) Prior Publication Data

US 2019/0098271 A1    Mar. 28, 2019

Related U.S. Application Data

(63) Continuation of application No. 15/280,661, filed on Sep. 29, 2016, now Pat. No. 10,178,363.

(Continued)

(51) Int. Cl.
*G06T 1/20* (2006.01)
*H01L 31/028* (2006.01)

(Continued)

(52) U.S. Cl.
CPC ........... *H04N 9/43* (2013.01); *G02B 27/1013* (2013.01); *G06T 1/20* (2013.01); *H01L 27/1462* (2013.01);

(Continued)

(58) Field of Classification Search
CPC .............................. H04N 9/43; G02B 27/1013
See application file for complete search history.

(56) References Cited

U.S. PATENT DOCUMENTS

| | | | | |
|---|---|---|---|---|
| 6,788,338 B1 * | 9/2004 | Dinev | ................. | H04N 5/2258 348/222.1 |
| 7,335,870 B1 * | 2/2008 | Yang | ................. | H01L 27/14618 250/208.1 |

(Continued)

OTHER PUBLICATIONS

International Search Report and Written Opinion for PCT Application No. PCT/US2016/054857, dated Jan. 16, 2017.

*Primary Examiner* — Irfan Habib

(57) ABSTRACT

HD color video using monochromatic CMOS image sensors integrated in a 3D package is provided. An example 3DIC package for color video includes a beam splitter to partition received light of an image stream into multiple light outputs. Multiple monochromatic CMOS image sensors are each coupled to one of the multiple light outputs to sense a monochromatic image stream at a respective component wavelength of the received light. Each monochromatic CMOS image sensor is specially constructed, doped, controlled, and tuned to its respective wavelength of light. A parallel processing integrator or interposer chip heterogeneously combines the respective monochromatic image streams into a full-spectrum color video stream, including parallel processing of an infrared or ultraviolet stream. The parallel processing of the monochromatic image streams provides reconstruction to HD or 4K HD color video at low light levels. Parallel processing to one interposer chip also enhances speed, spatial resolution, sensitivity, low light performance, and color reconstruction.

18 Claims, 6 Drawing Sheets

Related U.S. Application Data

(60) Provisional application No. 62/236,693, filed on Oct. 2, 2015.

(51) Int. Cl.

| | | |
|---|---|---|
| *H04N 9/43* | (2006.01) | |
| *G02B 27/10* | (2006.01) | |
| *H01L 27/146* | (2006.01) | |
| *H01L 31/0232* | (2014.01) | |
| *H01L 31/0296* | (2006.01) | |
| *H01L 31/0304* | (2006.01) | |
| *H01L 31/032* | (2006.01) | |
| *H04N 5/33* | (2006.01) | |
| *H04N 5/374* | (2011.01) | |
| *H04N 9/04* | (2006.01) | |
| *H04N 9/097* | (2006.01) | |
| *H04N 9/76* | (2006.01) | |

(52) U.S. Cl.
CPC ...... *H01L 27/1465* (2013.01); *H01L 27/1469* (2013.01); *H01L 27/14634* (2013.01); *H01L 27/14645* (2013.01); *H01L 27/14685* (2013.01); *H01L 31/028* (2013.01); *H01L 31/0296* (2013.01); *H01L 31/02322* (2013.01); *H01L 31/032* (2013.01); *H01L 31/0304* (2013.01); *H04N 5/332* (2013.01); *H04N 5/374* (2013.01); *H04N 9/045* (2013.01); *H04N 9/097* (2013.01); *H04N 9/76* (2013.01)

(56) References Cited

U.S. PATENT DOCUMENTS

| | | | | |
|---|---|---|---|---|
| 7,973,413 B2 * | 7/2011 | Kuo | H01L 21/76898 | 257/706 |
| 8,009,200 B2 * | 8/2011 | Goh | H04N 13/10 | 348/218.1 |
| 8,368,784 B2 * | 2/2013 | Yamaguchi | H01L 27/14632 | 348/272 |
| 8,426,961 B2 * | 4/2013 | Shih | H01L 21/486 | 257/698 |
| 8,487,259 B2 | 7/2013 | Cho et al. | | |
| 8,531,565 B2 * | 9/2013 | Wang | H01L 27/1463 | 348/241 |
| 8,541,820 B2 * | 9/2013 | Hayasaki | H01L 21/76898 | 257/184 |
| 8,669,174 B2 * | 3/2014 | Wu | H01L 21/6835 | 438/108 |
| 8,680,685 B2 | 3/2014 | Lim et al. | | |
| 8,773,562 B1 * | 7/2014 | Fan | H01L 27/14641 | 348/308 |
| 8,780,576 B2 | 7/2014 | Haba et al. | | |
| 8,802,504 B1 * | 8/2014 | Hou | H01L 23/49811 | 438/108 |
| 8,957,358 B2 * | 2/2015 | Wan | H01L 27/14609 | 250/208.1 |
| 9,142,586 B2 * | 9/2015 | Wang | H01L 27/14621 | |
| 9,153,565 B2 * | 10/2015 | Chen | H01L 27/14634 | |
| 9,161,017 B2 * | 10/2015 | Hiramoto | G03B 35/04 | |
| 9,206,965 B2 | 12/2015 | Barwicz et al. | | |
| 9,230,941 B2 | 1/2016 | Chen et al. | | |
| 9,232,158 B2 | 1/2016 | Olsen et al. | | |
| 9,287,310 B2 * | 3/2016 | Chen | H01L 27/14632 | |
| 9,287,312 B2 * | 3/2016 | Kao | H01L 27/14641 | |
| 9,299,649 B2 | 3/2016 | Chiu et al. | | |
| 9,412,725 B2 | 8/2016 | Chen et al. | | |
| 9,425,126 B2 | 8/2016 | Kuo et al. | | |
| 9,438,827 B2 | 9/2016 | Li | | |
| 9,443,783 B2 | 9/2016 | Lin et al. | | |
| 9,478,579 B2 * | 10/2016 | Dai | H01L 27/14609 | |
| 9,691,733 B1 * | 6/2017 | Shen | H01L 25/50 | |
| 9,706,132 B2 * | 7/2017 | Nisenzon | H04N 9/735 | |
| 9,712,759 B2 * | 7/2017 | Venkataraman | H01L 27/14618 | |
| 9,754,422 B2 * | 9/2017 | McMahon | G06T 19/20 | |
| 9,774,789 B2 * | 9/2017 | Ciurea | H04N 5/2258 | |
| 9,774,797 B2 * | 9/2017 | Richards | H04N 5/33 | |
| 9,807,322 B2 * | 10/2017 | Feder | H04N 5/35554 | |
| 9,887,243 B2 * | 2/2018 | Yamaguchi | H01L 27/14632 | |
| 9,888,194 B2 * | 2/2018 | Duparre | B82Y 30/00 | |
| 9,898,856 B2 * | 2/2018 | Yang | G06T 5/006 | |
| 9,912,928 B2 * | 3/2018 | Rivard | H04N 5/2354 | |
| 9,917,998 B2 * | 3/2018 | Venkataraman | H04N 5/2258 | |
| 9,918,017 B2 * | 3/2018 | Rivard | H04N 5/243 | |
| 10,050,018 B2 * | 8/2018 | Wu | H01L 24/02 | |
| 2011/0095418 A1 * | 4/2011 | Lim | H01L 23/3128 | 257/737 |
| 2013/0063918 A1 * | 3/2013 | Haba | H01L 23/49827 | 361/772 |
| 2013/0284885 A1 * | 10/2013 | Chen | H01L 25/16 | 250/208.1 |
| 2014/0001645 A1 * | 1/2014 | Lin | H01L 23/49816 | 257/774 |
| 2014/0049660 A1 * | 2/2014 | Olsen | H04N 5/3415 | 348/218.1 |
| 2014/0118424 A1 * | 5/2014 | Young | G01J 1/32 | 345/690 |
| 2014/0163319 A1 | 6/2014 | Blanquart et al. | | |
| 2014/0179034 A1 * | 6/2014 | Barwicz | F21V 21/00 | 438/26 |
| 2014/0225258 A1 * | 8/2014 | Chiu | H01L 23/49816 | 257/738 |
| 2015/0279816 A1 * | 10/2015 | Chen | H01L 25/0657 | 257/774 |
| 2015/0348872 A1 * | 12/2015 | Kuo | H01L 23/522 | 257/774 |

* cited by examiner

HD COLOR IMAGING USING MONOCHROMATIC CMOS IMAGE SENSORS INTEGRATED IN 3D PACKAGE

RELATED APPLICATIONS

This continuation patent application claims the benefit of priority to U.S. patent application Ser. No. 15/280,661 to Shen et al., filed Sep. 29, 2016, which in turn claims priority to U.S. Provisional Patent Application No. 62/236,693 to Shen et al., entitled, "HD Color Video Using Monochromatic CMOS Image Sensors Integrated In 3D Package," filed Oct. 2, 2015, all of these incorporated by reference herein in their entirety.

BACKGROUND

Conventional image sensor packages leave much room for improvement at the wafer level. For example, conventional backside illuminated (BSI) CMOS image sensor packages waste pixels by design. There is also an undesirable leakage current between color pixels. The conventional designs impose limitations on color reproduction, image detail, and speed/form factor. These limitations are variously caused by differences in the way that different wavelengths of light (different colors) interact with conventional monolithic filters and uniform image sensor materials. Blue wavelengths penetrate in a relatively shallow manner while red wavelengths penetrate much deeper.

As shown in FIG. 1, a conventional unbalanced Bayer filter mosaic array 50 is a color filter array (CFA) for arranging red-green-blue (RGB) color filters on a square grid of photosensors. The filter pattern is 50% green, 25% red and 25% blue, providing a RGGB filter 60. The conventional unbalanced Bayer filter mosaic array 50 has twice as many green filters as blue or red, which decreases accurate color reproduction of individual pixels. Due to the transmission spectral profiles 70 of the dyes commonly used in Bayer filters, the quantum efficiency of the red filters is significantly greater than that of the green and blue filters, which are close to each other in overall efficiency. After an image stream passes through the conventional Bayer filter 50, the materials of the conventional sensing surface are monolithic, so the thickness and doping profile of the sensor materials cannot be optimized for each color. Compensating for these conventional drawbacks results in additional complexity in conventional CMOS BSI designs for image sensor packages. Moreover, state-of-the-art high-definition (HD) video of 16M or greater calls for an approximately 1.0 nanosecond sensing and processing time.

In the conventional designs 50, three of the four pixels (the RGG pixels of a RGGB group of pixels) pass yellow light (at wavelength 585 nm) plus 20% blue light (435 nm). A blue pixel (B) passes nothing but blue light (435 nm). This imbalance causes a reduction in spatial resolution and sensitivity. Conventional designs compare the color (chromaticity) and intensity (luminosity) of a given pixel with neighboring pixels to reconstruct the signal to R, B, G, using various linear, next-neighbor, cubic, cubic spiral, cubic spline, and sinc interpolator patterns. For edge pixels with no neighboring pixels, the reconstruction is wasted. Other inherent problems with conventional designs include noise and crosstalk, with on-chip suppression and active decoupling executed at the sacrifice of speed.

SUMMARY

HD color video using monochromatic CMOS image sensors integrated in a 3D package is provided. An example 3DIC package for color video includes a beam splitter to partition received light of an image stream into multiple light outputs. Multiple monochromatic CMOS image sensors are each coupled to one of the multiple light outputs to sense a monochromatic image stream at a respective component wavelength of the received light. Each monochromatic CMOS image sensor is specially constructed, doped, controlled, and tuned to its respective wavelength of light. A parallel processing integrator or interposer chip heterogeneously combines the respective monochromatic image streams into a full-spectrum color video stream, including parallel processing of an infrared or ultraviolet stream. The parallel processing of the monochromatic image streams provides reconstruction to HD or 4K HD color video at low light levels. Parallel processing to one interposer chip also enhances speed, spatial resolution, sensitivity, low light performance, and color reconstruction.

This summary is not intended to identify key or essential features of the claimed subject matter, nor is it intended to be used as an aid in limiting the scope of the claimed subject matter.

BRIEF DESCRIPTION OF THE DRAWINGS

Certain embodiments of the disclosure will hereafter be described with reference to the accompanying drawings, wherein like reference numerals denote like elements. It should be understood, however, that the accompanying figures illustrate the various implementations described herein and are not meant to limit the scope of various technologies described herein.

DETAILED DESCRIPTION

Overview

This disclosure describes example high-definition (HD) color video using monochromatic CMOS image sensors integrated in a 3D package.

Figure 1:
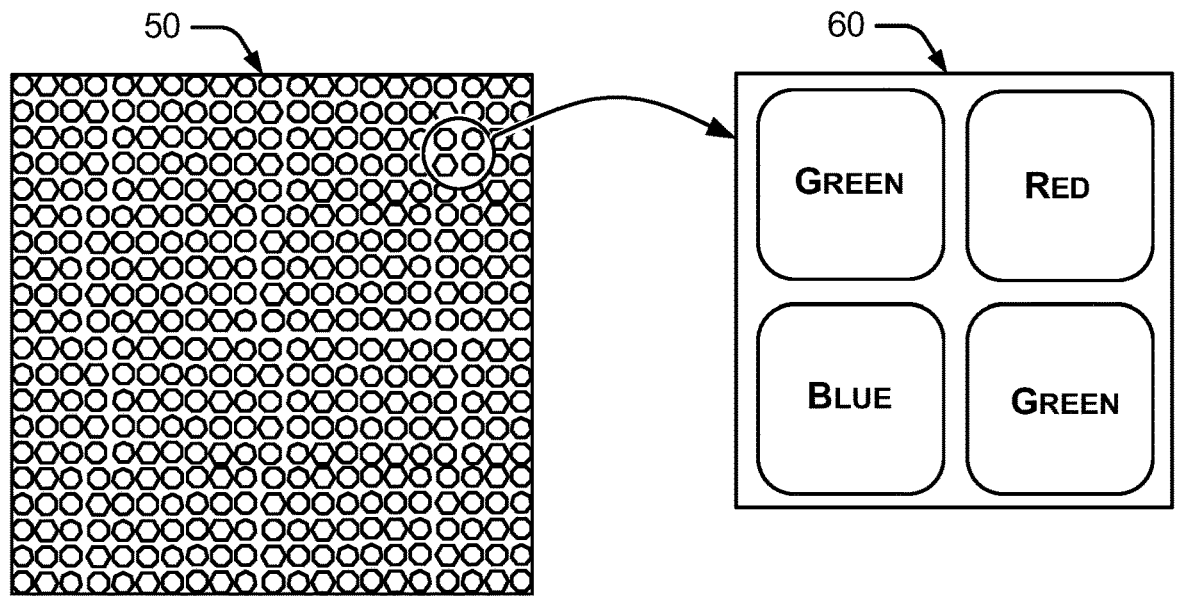
FIG. 1 is a diagram of prior art Bayer pattern filter mosaic limitations.
Figure 1:
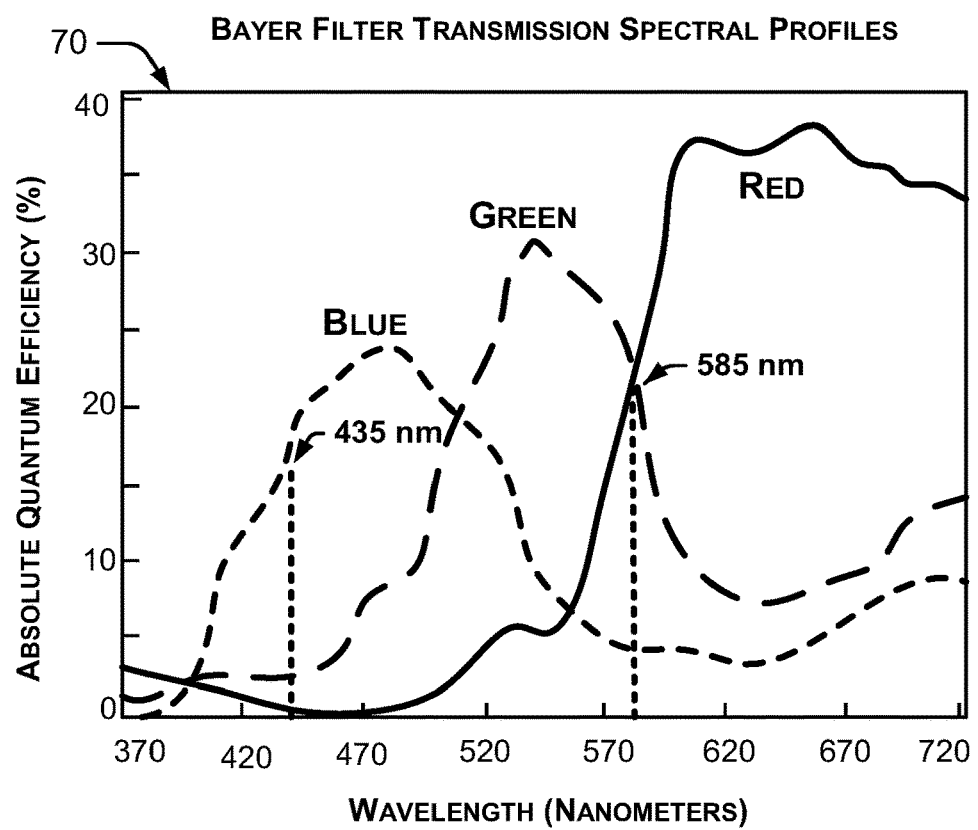
Figure 2:
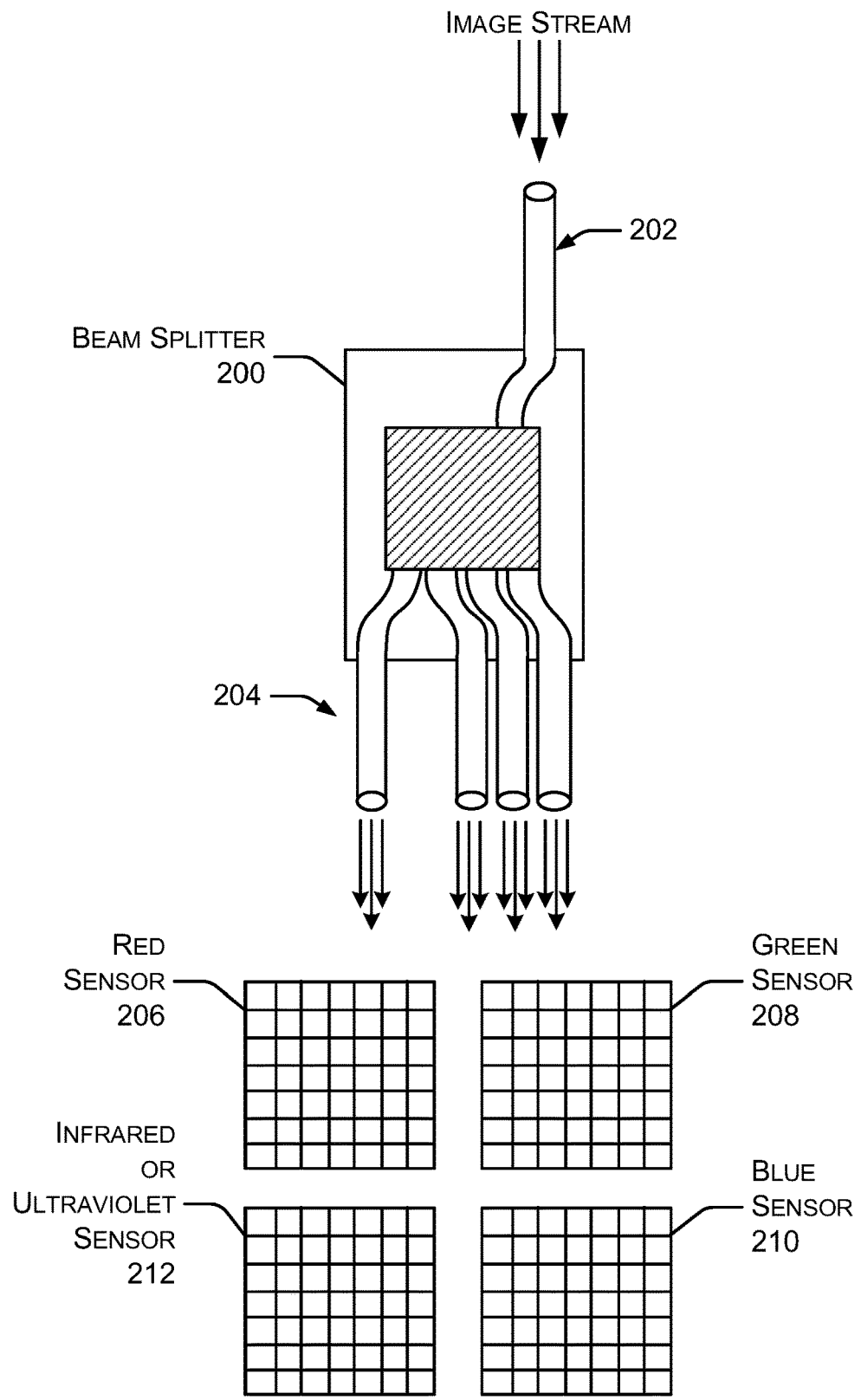
FIG. 2 is a diagram of an example system for splitting an image stream into multiple instances for image sensors each dedicated to one color or wavelength range.

FIG. 2 shows an example system for capturing and splitting an image stream into multiple instances of the same video stream for image sensors each dedicated to one color or wavelength range. In an implementation, an example 3DIC package for generating full-spectrum HD color video includes an optical "beam" splitter 200 to partition received light of an image stream into multiple light outputs. The beam splitter 200 may have a single optical input 202 which branches to multiple optical outputs 204 conveying the same image stream as the input 202 receives. Alternatives, such as prisms, may be used in place of a fiber optic or tree coupler beam splitter 200. Thus, the optical splitter 200 can be a tree coupler, prism, fiber optic coupler, or other optical beam splitter. Multiple monochromatic CMOS image sensors, such as a red sensor 206, a green sensor 208, a blue sensor 210, and an infrared or ultraviolet sensor 212, are each coupled to one of the multiple light outputs to monochromatically sense the corresponding image stream at a respective component wavelength of the received light. An integrator or interposer chip heterogeneously combines the respective monochromatic image streams into a full-spectrum color video stream. The different monochromatic image streams are processed in parallel to reconstruct the full-spectrum video stream, including optional parallel processing of the infrared or the ultraviolet stream. Parallel processing of monochromatic image streams improves quantum efficiency and can provide reconstruction to HD or 4K HD color video at very low light levels. Parallel processing to one interposer chip also enhances speed, spatial resolution, sensitivity, low light performance, and color reconstruction.

The acronym CMOS means "complementary-metal-oxide-semiconductor." "Monochromatic" as used herein means a single color or single wavelength of light, or a range of adjacent wavelengths approximating a single color, such as red or a range of reds, as sensed by humans or defined scientifically to define a definite range or a limited series of adjacent electromagnetic radiation wavelengths.

Depletion Region Width Considerations for Different Wavelengths

In an implementation, an example 3DIC package for color video includes the multiple monochromatic CMOS image sensors 206 & 208 & 210 & 212, each coupled to a light output 204 of a beam splitter 200 to sense a monochromatic image stream from the full-spectrum image stream at a respective component wavelength of the received light. In an implementation, for sensing a particular wavelength of light, given a semiconductor material with a respective dielectric constant, the depletion layer width W can be determined by Equations (1)-(4):

$$W = x_p + x_n = \sqrt{\frac{2\varepsilon}{q} V_o \left(\frac{1}{N_A} + \frac{1}{N_D}\right)} \quad (1)$$

$$x_p = W \frac{N_D}{N_A + N_D} \quad (2)$$

$$x_n = W \frac{N_A}{N_A + N_D} \quad (3)$$

$$V_o = \frac{kT}{q} \ln\left(\frac{N_A N_D}{n_i^2}\right) \quad (4)$$

where $N_A/N_D$ is the carrier concentration, $V_o$ is the potential across the junction, that is, the built-in voltage that is calculated separately, $x_p$ is the penetration of the space charge region into the p-side, and $x_n$ is the penetration into the n-side. The total width W of the depletion region is the sum of $x_p$ and $x_n$. Hence, a lightly doped semiconductor is one in which the depletion width is large and a heavily doped semiconductor is one in which the depletion width is small.

The desired depletion width (for a given wavelength) can be achieved by selecting the voltage potential and the appropriate dopant for each individual monochromatic CMOS image sensor. Monochromatic, as used herein and introduced above, means a particular wavelength or a limited range of wavelengths characteristic of, or comprising, a component of the electromagnetic radiation spectrum, for example a range of wavelengths approximating the color red or approximating a range or a series of red colors.

Materials for optimally sensing the wavelengths for blue, green, and red need different depletion regions to increase quantum efficiency. Blue, for example, is in the 0.1 micrometer range. Red, on the other hand, is in the 1.0-5.0 micrometer range (unlikely to deplete that deep). In an implementation, each of the multiple monochromatic CMOS image sensors 206 & 208 & 210 & 212 has a different voltage potential and different doping for the respective color (wavelength or wavelength range) to be sensed. Moreover, each monochromatic CMOS image sensor 206 & 208 & 210 & 212 can have a different thickness suited to sensing the respective color (wavelength) and a respective antireflection layer also suited to sensing the respective color (wavelength). These customizations for each wavelength to be sensed are not possible in conventional image sensor designs.

Example Systems

Figure 3:
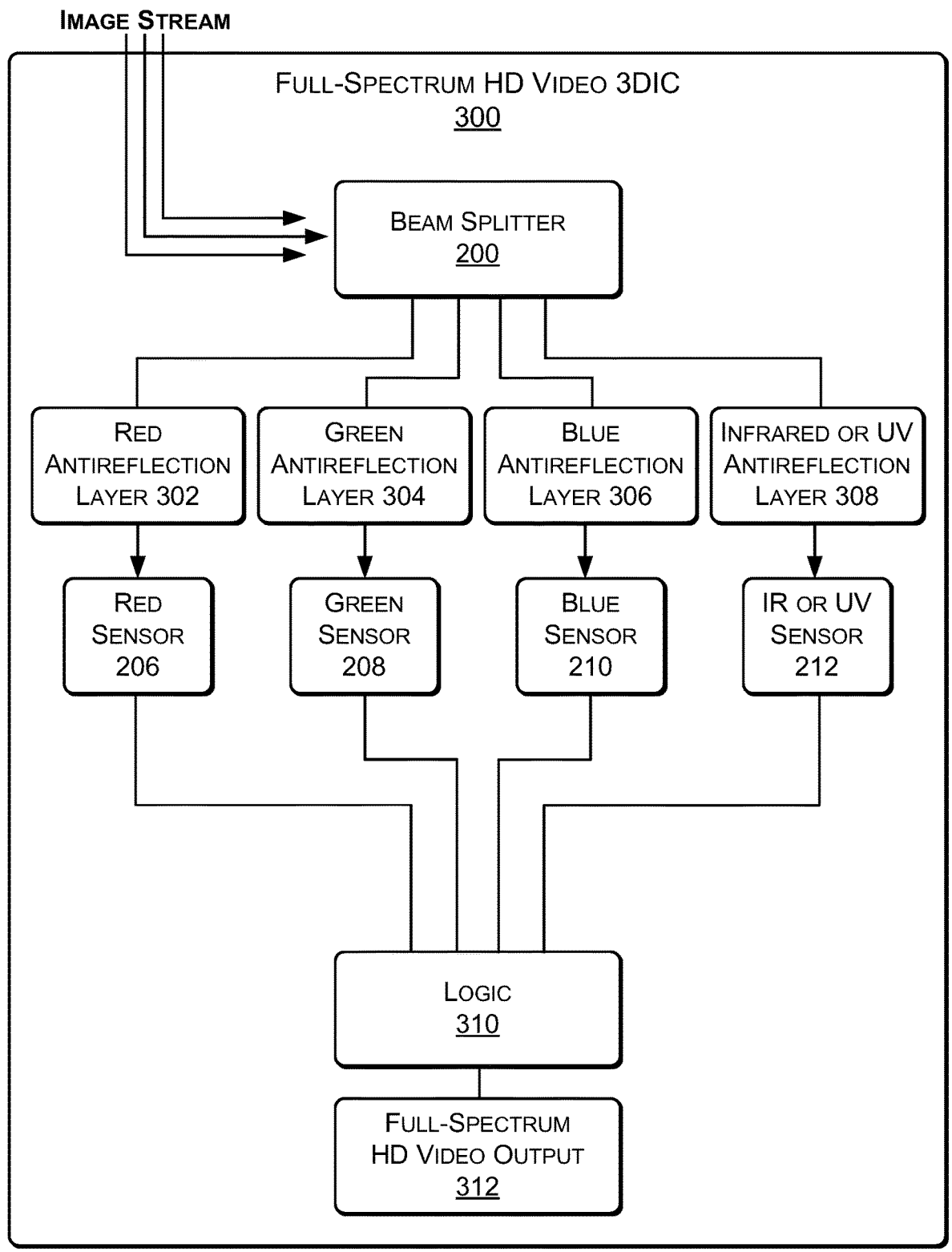
FIG. 3 is a block diagram of an example 3-dimensional (3D) integrated circuit (IC) package for full-spectrum HD video.

FIG. 3 shows an example 3DIC image sensor package 300 that uses four separate monochromatic CMOS sensors, for example, one sensor each for red 206, green 208, blue 210, and infrared 212. An ultraviolet sensor (or another wavelength range) may also be substituted for the infrared sensor 212. The infrared monochromatic CMOS sensor 212 may be composed of InGaAs or similar materials. Integrating a material to sense infrared 212 is not easily performed with conventional CMOS image sensor designs, but can enhance performance because of the extra visual information available in infrared, and the capability of night vision provided by infrared.

The example 3DIC image sensor package 300 of FIG. 3 can provide full-spectrum HD video. The example 3DIC image sensor package 300 includes a beam splitter 200, but the beam splitter 200 or a comparable alternative can also reside separately from the 3DIC 300 in some implementations. The 3DIC package 300 may include multiple antireflection layers, each situated and tuned to the color of light or the light wavelength that corresponds to the sensing capability of a respective monochromatic CMOS image sensor. Thus, a red antireflection layer 302 can be associated with the red sensor 206, a green antireflection layer 304 can be associated with the green sensor 208, a blue antireflection layer 306 can be associated with the blue sensor 210, and an infrared or ultraviolet antireflection layer 308 can be associated with the infrared or ultraviolet sensor 212.

Each monochromatic CMOS image sensor 206 & 208 & 210 & 212 is separately coupled to the logic component 310, which can integrate the sensed monochromatic image streams into an integrated full-spectrum (full color) image stream through parallel processing. The full-spectrum image stream can be sent to an HD video output 312.

Figure 4:
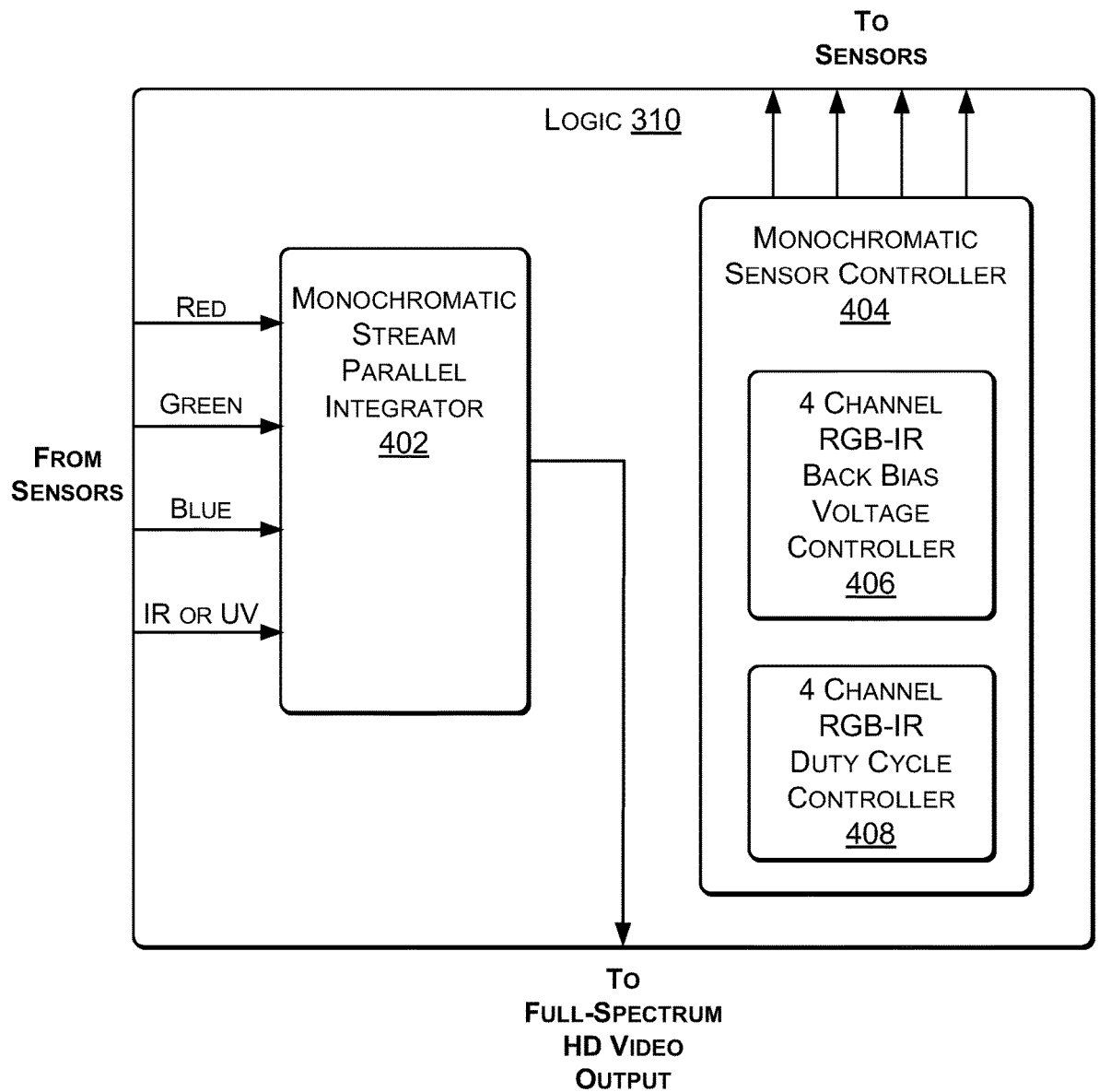
FIG. 4 is a block diagram an example logic component of the example 3DIC of FIG. 3, including a parallel integrator to combine monochromatic image streams.

FIG. 4 shows the example logic component 310 of FIG. 3 in greater detail. In an example implementation, the logic component 310 includes a monochromatic stream parallel integrator 402, and a monochromatic sensor controller 404. The monochromatic sensor controller 404 can further include a back bias voltage controller, such as a 4-channel controller 406 for individually controlling the back bias voltage of each of the red sensor 206, the green sensor 208, the blue sensor 210, and the infrared or ultraviolet sensor 212. The monochromatic sensor controller 404 may also further include a duty cycle controller, such as a 4-channel controller 408 for individually controlling the duty cycles of each of each of the red sensor 206, the green sensor 208, the blue sensor 210, and the infrared or ultraviolet sensor 212.

In an implementation, the 3DIC package 300, including the logic component 310, has multiple chips sensing and processing in parallel, providing a multifold improvement in speed, especially for HD video, over conventional designs. Each antireflection layer 302 & 304 & 306 & 308 is also less expensive than conventional layers, and more effective at targeting specific wavelength ranges, instead of the conventional broadband approach, which requires more antireflection layers.

The example 3DIC image sensor package 300 can be constructed with standardized CMOS fabrication techniques. Non-active or deactivated photodiodes can be mapped out. The different monochromatic image streams generated by the sensors can be heterogeneously integrated onto one parallel integrator 402, such as an interposer chip, to provide faster speeds.

Example Sensor Materials

Integration of III-V semiconductor materials, for example to a CMOS image sensor wafer for sensing infrared 212, presents some challenges, but can provide higher sensitivity, higher spatial resolution, and accurate color reconstruction at low light levels or night vision light levels. The III-V semiconductor materials are more sensitive to infrared wavelengths than to visible wavelengths. The III-V wafer sizes to be used can be small (but up to 150 mm). In the example system, however, it is advantageous to integrate III-V dies onto CMOS image sensor (CIS) wafers via chip-to-wafer bonding, for infrared imaging in parallel with visible imaging. Table (1) below shows example materials for sensing infrared in the example system:

TABLE (1)

| Material | Type | Spectral range (μm) | Wavenumber (cm$^{-1}$) |
| --- | --- | --- | --- |
| Indium gallium arsenide (InGaAs) | photodiode | 0.7-2.6 | 14300-3800 |
| Germanium | photodiode | 0.8-1.7 | 12500-5900 |
| Lead sulfide (PbS) | photoconductive | 1-3.2 | 10000-3200 |
| Lead selenide (PbSe) | photoconductive | 1.5-5.2 | 6700-1900 |
| Indium antimonide (InSb) | photoconductive | 1-6.7 | 10000-1500 |
| Indium arsenide (InAs) | photovoltaic | 1-3.8 | 10000-2600 |
| Platinum silicide (PtSi) | photovoltaic | 1-5 | 10000-2000 |
| Indium antimonide (InSb) | photodiode | 1-5.5 | 10000-1800 |
| Mercury cadmium telluride (MCT, HgCdTe) | photoconductive | 0.8-25 | 12500-400 |
| Mercury zinc telluride (MZT, HgZnTe) | photoconductive | | |
| Lithium tantalate (LiTaO$_3$) | pyroelectric | | |
| Triglycine sulfate (TGS and DTGS) | pyroelectric | | |
| Vanadium pentoxide | | | |

Each of the multiple monochromatic CMOS image sensors 206 & 208 & 210 & 212 may have a different thickness and a different doping profile tuned to optimize photodetection of the particular respective monochromatic component wavelength of the received light at a high resolution, even at low light levels or at night vision light levels.

The example integrator, interposer, or other logic electronics 310 can be configured to apply a different back bias voltage 406 to each of the multiple monochromatic CMOS image sensors 206 & 208 & 210 & 212 to control or optimize a depletion width of each individual monochromatic CMOS image sensor 206 & 208 & 210 & 212.

The example integrator, interposer, or other logic electronics 310 can also be configured to apply a different duty cycle 408 to each of the multiple monochromatic CMOS image sensors 206 & 208 & 210 & 212 to tune each of the multiple monochromatic CMOS image sensors 206 & 208 & 210 & 212 for improved performance, such as a tuned sensitivity to a particular component wavelength of the received light and/or an improved quantum efficiency at the particular component wavelength of the received light.

At least one of the multiple monochromatic CMOS image sensors 206 & 208 & 210 & 212 can be composed of a material other than a silicon photodiode material. For example, the material other than a silicon photodiode material can be indium gallium arsenide (InGaAs), germanium (Ge), lead sulfide (PbS), lead selenide (PbSe), photoconductive indium antimonide (InSb), indium arsenide (InAs), Platinum slilcide (PtSi), photodiode-type indium antimonide (InSb), mercury cadmium telluride (MCT, HgCdTe), mercury zinc telluride (MZT, HgZnTe), lithium tantalite (LiTaO3), or triglycine sulfate (TGS and DTGS).

The example 3DIC package 300 can include an up-conversion material for detecting infrared photons, and/or a down-conversion material for detecting ultraviolet photons.

In an implementation, the example 3DIC package 300 may include at least one of the multiple monochromatic CMOS image sensors 206 & 208 & 210 & 212 further utilizing a quantum dot photodetector (QDP) tuned to a component wavelength of the received light or other quantum dot photosensing material.

In various implementations, the multiple monochromatic CMOS image sensors 206 & 208 & 210 & 212 may also integrate their monochromatic output with a full-spectrum sensor, a RGB sensor, a white sensor, a black & white infrared sensor, an ultraviolet sensor, a high frequency microwave sensor, and so forth.

Example Methods

Figure 5:
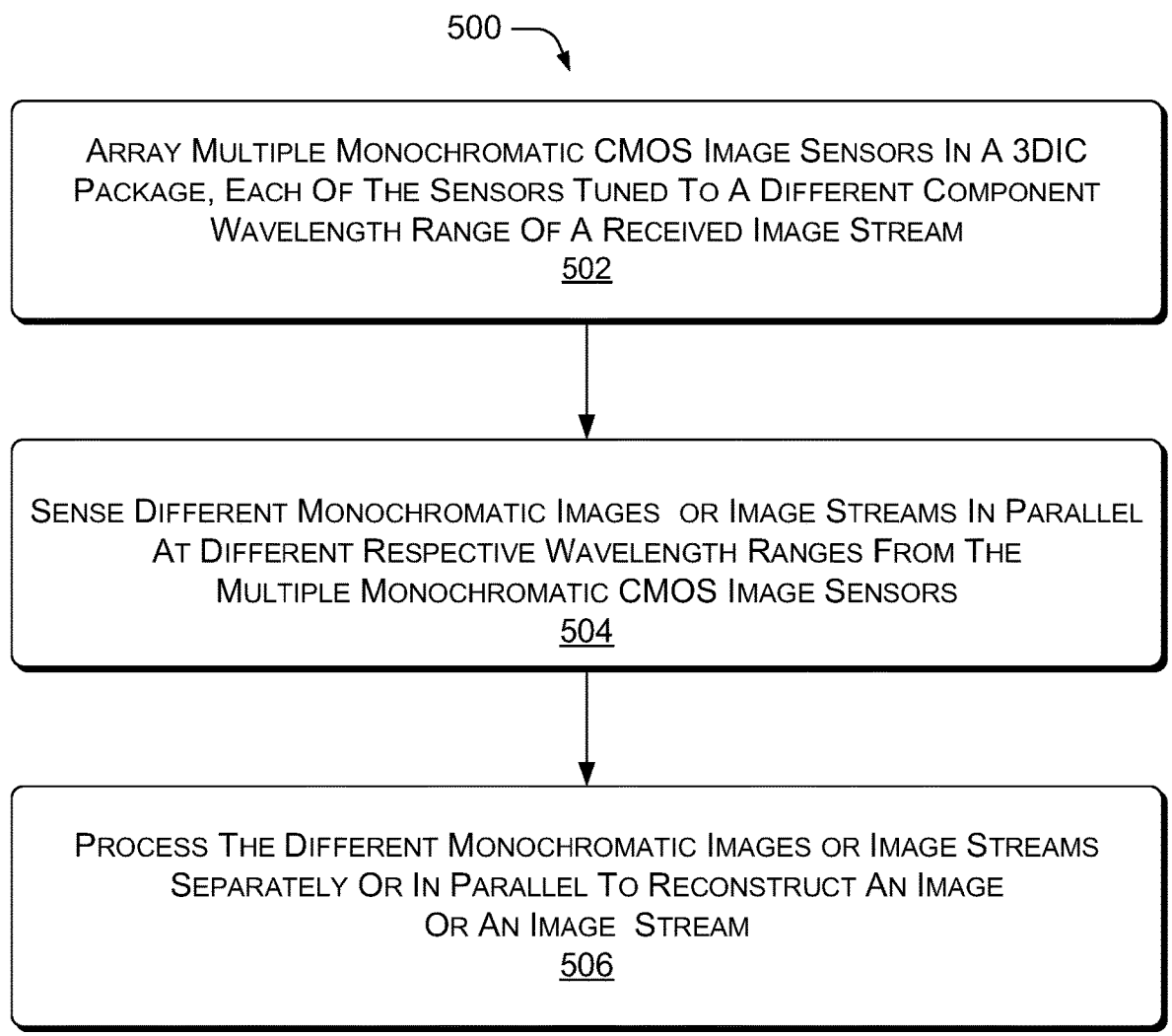
FIG. 5 is a flow diagram of an example method of utilizing multiple monochromatic CMOS image sensors in parallel to reconstruct an HD color video stream.

FIG. 5 shows an example method 500 of utilizing multiple monochromatic CMOS image sensors in parallel to reconstruct an HD color video stream. In the flow diagram, the operations are shown as individual blocks.

At block 502, multiple monochromatic CMOS image sensors are arrayed in a 3DIC package, each of the multiple monochromatic CMOS image sensors tuned to a different component wavelength range of a received image stream.

At block 504, different monochromatic image streams are sensed in parallel at different respective wavelength ranges by the multiple monochromatic CMOS image sensors.

At block 506, the different monochromatic image streams are processed in parallel to reconstruct a full spectrum HD color video stream.

The example method 500 may further include sensing and processing an infrared monochromatic image stream or an ultraviolet monochromatic image stream in parallel with visible monochromatic image streams.

The example method 500 can include sensing the different monochromatic image streams via the multiple monochromatic CMOS image sensors at a low light level or a night vision light level and reconstructing an HD full spectrum color image stream or a 4K HD color video stream from the different monochromatic image streams sensed at the low light level or the night vision light level.

The example method 500 may include integrating the different monochromatic image streams on one interposer chip to increase a speed of the parallel processing and a speed of the reconstruction of the full spectrum image stream.

The example method 500 may also include heterogeneously integrating the different monochromatic image streams into a full-spectrum image stream to achieve an enhanced spatial resolution, a higher sensitivity, an improved low light performance, or an improved color reconstruction.

Figure 6:
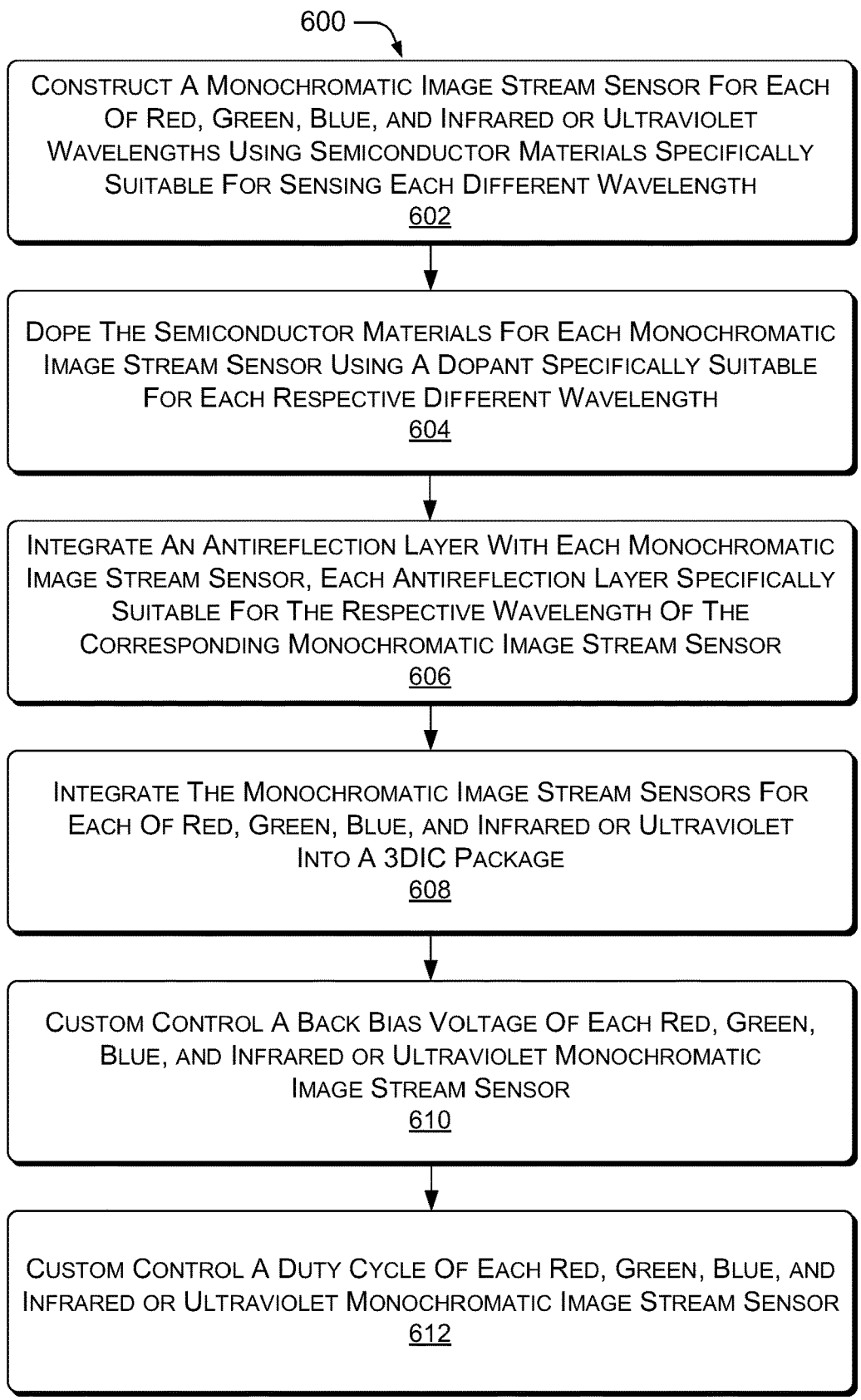
FIG. 6 is a flow diagram of an example method of constructing and controlling monochromatic image stream sensors, each monochromatic image stream sensor constructed and controlled to sense a specific wavelength or color of light.

FIG. 6 shows an example method 600 of constructing and controlling monochromatic image stream sensors, each monochromatic image stream sensor constructed and controlled for a specific wavelength or color of light. In the flow diagram, the operations are shown as individual blocks.

At block 602, a monochromatic image stream sensor is constructed for each of red, green, blue, and infrared (or ultraviolet) wavelengths using semiconductor materials specifically suitable for sensing each different wavelength.

At block 604, the semiconductor material for each monochromatic image stream sensor is doped using a dopant specifically suitable for each respective different wavelength.

At block 606, an antireflection layer is integrated with each monochromatic image stream sensor, each antireflection layer specifically suitable for the respective wavelength of the corresponding monochromatic image stream sensor.

At block 608, the monochromatic image stream sensors for each of red, green, blue, and infrared or ultraviolet are integrated into a 3DIC package.

At block 610, a back bias voltage is custom controlled for each red, green, blue, and infrared or ultraviolet image stream sensor.

At block 612, a duty cycle is custom controlled for each red, green, blue, and infrared or ultraviolet image stream sensor.

The present disclosure has been disclosed with respect to a limited number of embodiments, but those skilled in the art, having the benefit of this disclosure, will appreciate numerous modifications and variations from the description provided herein. It is intended that the appended claims cover such modifications and variations as fall within the true spirit and scope of the disclosure.

The invention claimed is:

1. A method, comprising:
    configuring a first die of a CMOS wafer for sensing a monochromatic red light at a first CMOS sensor configured to sense only the monochromatic red light;
    configuring the first die of the CMOS wafer for sensing a monochromatic green light at a second CMOS sensor configured to sense only the monochromatic green light;
    configuring the first die of the CMOS wafer for sensing a monochromatic blue light at a third CMOS sensor configured to sense only the monochromatic blue light;
    bonding a second die comprising a III-V semiconductor material to the first die of the CMOS wafer for sensing an infrared light; and
    bonding at least the first die of the CMOS wafer to a third die for logically combining respective digital signals representing the monochromatic red light, the monochromatic green light, the monochromatic blue light, and the infrared light into a full spectrum HD or 4K color video stream.

2. The method of claim 1, further comprising bonding a fourth die to at least the first die, for sensing an ultraviolet light; wherein the third die combines a digital signal representing the ultraviolet light with the respective digital signals representing the monochromatic red light, the monochromatic green light, the monochromatic blue light, and the infrared light to output a full spectrum HD or 4K color video showing ultraviolet video features or fluorescent video features not visible to an unaided human eye.

3. The method of claim 1, further comprising configuring the third die to individually control a separate different duty cycle for each of the first CMOS sensor, the second CMOS sensor, the third CMOS sensor, and the second die.

4. A CMOS image sensor, comprising:
    a first semiconductor material in first photodiodes fabricated on a wafer to convert only red photons into a first digital voltage signal;
    a second semiconductor material in second photodiodes fabricated on the wafer to convert only green photons into a second digital voltage signal;
    a third semiconductor material in third photodiodes fabricated on the wafer to convert only blue photons into a third digital voltage signal; and
    a chip comprising a III-V semiconductor material bonded onto the wafer to convert infrared photons into a fourth digital voltage signal for infrared imaging in parallel with red, green, and blue imaging.

5. The CMOS image sensor of claim 4, further comprising a chip comprising a semiconductor material bonded onto the wafer to convert ultraviolet photons into a fifth digital voltage signal for ultraviolet imaging in parallel with the red, green, blue, and infrared imaging.

6. The CMOS image sensor of claim 5, further comprising logic to amplify one or more of the first digital voltage signal, the second digital voltage signal, and the third digital voltage signal based on one or both of the fourth digital voltage signal of the infrared photons and the fifth digital signal of the ultraviolet photons to produce full spectrum HD or 4K video stream at a low light level or at a night vision light level.

7. The CMOS image sensor of claim 5, further comprising logic to color code one or more visual components of a full spectrum HD or 4K video, the one or more visual components representing one or both of the fourth digital voltage signal of the infrared photons and the fifth digital voltage signal of the ultraviolet photons.

8. The CMOS image sensor of claim 4, wherein the first semiconductor material, the second semiconductor material, and the third semiconductor material are on respective separate pixel arrays, and the logic combines a respective monochromatic video stream from each respective pixel array to produce full spectrum HD or 4K video stream.

9. The CMOS image sensor of claim 4, wherein instances of the first semiconductor material, the second semiconductor material, and the third semiconductor material are disposed in respective photodiodes in each pixel of a single array of pixels of the CMOS image sensor, and the logic combines a respective monochromatic signal from each photodiode in each pixel to produce full spectrum HD or 4K video stream.

10. The CMOS sensor of claim 9, wherein an amplification of the monochromatic signals is integrated directly in each pixel.

11. The CMOS sensor of claim 9, further comprising a parallel readout architecture, wherein each pixel is addressed individually or groups of the pixels are read out in parallel.

12. The CMOS sensor of claim 4, wherein a logic performs parallel processing of the first digital voltage signal, the second digital voltage signal, and the third digital voltage signal.

13. The CMOS sensor of claim 4, wherein a logic performs separate processing of the first digital voltage signal, the second digital voltage signal, and the third digital voltage signal.

14. The CMOS image sensor of claim 4, further comprising logic to integrate the first, second, third, and fourth digital voltage signals into a full spectrum HD or 4K video stream.

15. The CMOS image sensor of claim 4, further comprising logic for integrating first, second, and third digital voltage signals derived from red, green, and blue photons in parallel with the fourth digital voltage signal converted from the infrared photons to generate full spectrum HD or 4K video stream; and
   wherein the first, second, and third digital voltage signals are derived from red, green, and blue photons received at a low light level or at a night vision light level.

16. A camera, comprising:
   a first die comprising a CMOS image sensor including multiple different semiconductor materials in respective photodiodes for sensing respective different monochromatic components of a light;
   a second die comprising a III-V semiconductor material bonded to the first die for sensing an infrared component of the light; and
   a parallel processor for combining digital signals representing the respective different monochromatic components and the infrared component into a full spectrum HD or 4K video stream.

17. The camera of claim 16, wherein the parallel processor comprises a single interposer chip capable of enhancing a speed, a spatial resolution, a sensitivity, a low light performance, and a color reconstruction of the parallel processing.

18. The camera of claim 16, wherein the second die comprising the III-V semiconductor material enables the parallel processor to compile the full spectrum HD or 4K video stream at a low light level or a night vision light level using a combination of other non-infrared monochromatic components of the full spectrum HD or 4K video stream.

* * * * *